United States Patent
Jung et al.

(10) Patent No.: US 8,119,526 B2
(45) Date of Patent: Feb. 21, 2012

(54) METHOD OF FORMING A METAL LAYER AND A METHOD OF FABRICATING A SEMICONDUCTOR DEVICE

(75) Inventors: Eun-ji Jung, Hwaseong-si (KR); Woong-hee Sohn, Seoul (KR); Su-kyoung Kim, Suwon-si (KR); Gil-heyun Choi, Seoul (KR); Byung-hee Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/955,093

(22) Filed: Nov. 29, 2010

(65) Prior Publication Data

US 2011/0201198 A1    Aug. 18, 2011

(30) Foreign Application Priority Data

Feb. 16, 2010 (KR) .......................... 10-2010-0013856

(51) Int. Cl.
*H01L 21/44* (2006.01)

(52) U.S. Cl. .. 438/681; 438/677; 438/687; 257/E21.584

(58) Field of Classification Search .................. 438/681, 438/677, 687; 257/E21.584
See application file for complete search history.

(56) References Cited

U.S. PATENT DOCUMENTS

| 7,576,006 | B1 * | 8/2009 | Yu et al. ......................... 438/687 |
| 7,776,743 | B2 * | 8/2010 | Russell et al. ................. 438/687 |
| 2006/0157854 | A1 * | 7/2006 | Takewaki et al. ............. 257/758 |
| 2010/0133648 | A1 * | 6/2010 | Seidel et al. ................... 257/522 |

FOREIGN PATENT DOCUMENTS

| KR | 1020010017057 A | 3/2001 |
| KR | 100698088 B1 | 3/2007 |
| KR | 1020080101573 A | 11/2008 |
| KR | 1020080110897 A | 12/2008 |

\* cited by examiner

*Primary Examiner* — Trung Q Dang

(74) *Attorney, Agent, or Firm* — Volentine & Whitt, PLLC

(57) ABSTRACT

A method of forming metal films includes preparing a substrate, on which an insulating layer and a metal layer formed of a first metal are exposed; and forming a metal capping layer by supplying an organic precursor of a second metal onto the substrate to deposit the second metal simultaneously on the insulating layer and the metal layer, wherein the second metal capping layer has different thicknesses on the insulating layer and the metal layer.

20 Claims, 7 Drawing Sheets

(I)  (II)

METHOD OF FORMING A METAL LAYER AND A METHOD OF FABRICATING A SEMICONDUCTOR DEVICE

CROSS-REFERENCE TO RELATED APPLICATIONS

This U.S. non-provisional patent application claims the benefit under 35 U.S.C. §119 to Korean Patent Application No. 10-2010-0013856 filed on Feb. 16, 2010, the subject matter of which is hereby incorporated by reference.

BACKGROUND

The inventive concept relates to methods fabricating a metal film, and semiconductor device fabrication methods including same. More particularly, the inventive concept relates to methods of fabricating a metal film that may be selectively deposited on an under-layer, semiconductor device fabrication methods including same, as well as semiconductor devices incorporating a metal film so fabricated.

Contemporary semiconductor devices contain many elements, material layers, and components that are very densely integrated. Among these elements are many metal wires. The size, composition, and layout of metal wires within semiconductor devices is a matter of considerable research and development, since signal transmission at ever-increasing speeds and overall device reliability are highly related to the performance of the metal wires. This being the case, fabrication cost is also a major driver in the selection of technologies and methods used to fabricate metal wires. That is, low expense and fabrication simplicity often determine the technologies used to actually form metal wires during semiconductor device fabrication.

SUMMARY

Embodiments of the inventive concept provide a method of forming more reliable metal layers providing improved signal transmission speed while by an overall simpler fabrication process at lower costs. Embodiments of the inventive concept also provide a method of fabricating a semiconductor device having improved reliability with greater productivity by providing reliable metal layer (which may be used as metal wires) providing faster signal transmission speeds with simpler fabrication processes and lower fabrication costs.

According to an aspect of the inventive concept, there is provided a method of forming metal films, the method including; preparing a substrate having an insulating layer and a metal layer comprising a first metal, and forming a metal capping layer by supplying an organic precursor of a second metal onto the substrate to deposit the second metal simultaneously on the insulating layer and the metal layer, wherein the metal capping layer has different thicknesses on the insulating layer and the metal layer.

The formation of the metal capping layer may be performed at a processing temperature in a range of about 250° C. to 350° C., and at a processing pressure in a range of about 0.1 Torr to 10 Torr.

The first metal and the second metal may be different from each other.

The organic precursor may be a compound represented by the formula $Cy-M-(R)_2$, where Cy is a functional group including a cyclic compound having negative polarity, M is a trivalent metal atom, and R is a carbon compound having less polarity than the polarity of the R.

In this regard, M may be Co, Al, Fe, Cr, Ni, Mn, Cu, or Au. R may be a carbonyl group (—C≡O), a cyano group (—C≡N), or a saturated or unsaturated hydrocarbon group.

The second metal may be Co, and the organic precursor is cyclopentadienylcobalt dicarbonyl.

The first metal may be one selected from the group consisting of Cu, W, Al, Ti, Ta, Au, Ag, and nitrides thereof, or combinations thereof.

The insulating layer may be one selected from the group consisting of a silicon oxide layer, a silicon oxynitride layer, a $(Ba_x, Sr_{1-x})TiO_3$(BST) layer, a $TiO_2$ layer, a $Ta_2O_5$ layer, a $Al_2O_3$ layer, a $ZrO_2$ layer, a Zr silicate layer, a $HfO_2$ layer, and a Hf silicate layer, or a combination thereof.

The metal capping layer may have a portion formed on the metal layer that is thicker than a portion formed on the insulating layer. The method may further include forming a metal capping layer pattern that is a remnant of the metal capping layer on the metal layer by exposing the metal capping layer under an etching atmosphere until the insulating is exposed, after forming the metal capping layer. The etching atmosphere may be a wet-etching process using an etchant. The etching atmosphere may be a dry-etching process that is an etch-back process of the metal capping layer.

According to another aspect of the inventive concept, there is provided a method of fabricating a semiconductor device, the method including; forming an insulating layer pattern having holes for exposing conductive regions of a substrate, on the substrate having the conductive regions; forming a first metal layer in the holes, forming a second metal layer on the insulating layer pattern and the first metal layer by supplying a metal organic precursor onto the substrate under processing conditions, in which the second metal layer is formed having a thicker portion on the first metal layer than that on the insulating layer pattern, and forming a second metal capping layer pattern that is a remnant of the first metal layer by exposing the second metal layer to an etching atmosphere until the portion of the second metal layer on the insulating layer pattern is removed and the insulating layer pattern is exposed.

The processing conditions may include a temperature in a range of about 250° C. to 350° C. and a pressure in a range of about 0.1 Torr to 10 Torr.

The first metal layer may be formed of one selected from the group consisting of Cu, W, Al, Ti, Ta, Au, Ag, and nitrides thereof, or combination thereof.

According to another aspect of the inventive concept, there is provided a method of fabricating a semiconductor device, the method including; forming an insulating layer pattern having holes for exposing conductive regions of a substrate, on the substrate having the conductive regions, forming a barrier layer and a metal layer sequentially in the holes, forming a capping layer on the insulating layer pattern, the barrier layer, and the metal layer by supplying a Co organic precursor onto the substrate under processing conditions in which a temperature is maintained in about 250° C. to 350° C. and a pressure is maintained in about 0.1 Torr to 10 Torr, wherein the capping layer has a thicker portion on the metal layer than on the insulating layer pattern; and forming a capping layer pattern that is a remnant of the capping layer remaining on the metal layer by removing the capping layer to a predetermined thickness from an upper surface of the capping layer until the insulating layer pattern is exposed.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
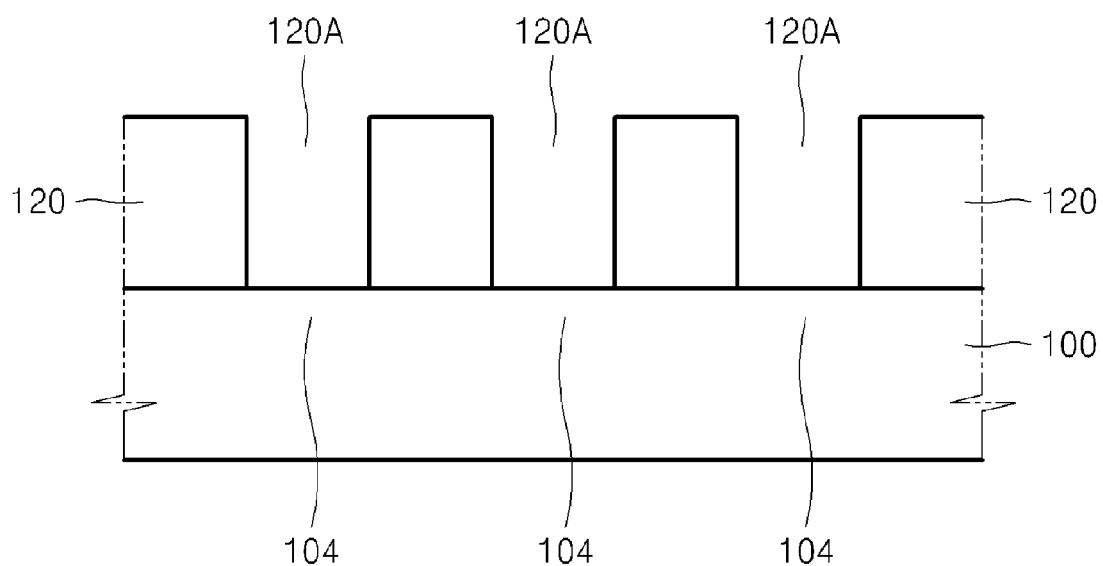
FIGS. 1A through 1F are related cross-sectional views illustrating a method of forming a metal film according to an embodiment of the inventive concept.

Embodiments of the inventive concept will now be described in some additional detail with reference to the accompanying drawings. The inventive concept may, however, be embodied in many different forms and should not be construed as being limited to only the illustrated embodiments. Rather, the illustrated embodiments are provided so that this disclosure will be thorough and complete, and will fully convey the concept of the inventive concept to those skilled in the art. In the drawings, the thickness and relative thicknesses of layers and/or regions may be exaggerated for clarity. Throughout the drawings and written description like reference numbers and labels denote like or similar elements.

FIGS. 1A through 1F are cross-sectional views illustrating a method of forming a metal film according to an embodiment of the inventive concept.

Referring to FIG. 1A, a substrate 100 is provided with conductive regions 104, and an insulating layer pattern 120 including holes 120A selectively exposing portions of the conductive region 104.

The insulating layer pattern 120 may be formed of a silicon oxide layer, a silicon oxynitride oxide layer, a high-k film, or a combination thereof. The high-k layer may include, for example, $(Ba_X, Sr_{1-X})TiO_3(BST)$, $TiO_2$, $Ta_2O_5$, $Al_2O_3$, $ZrO_2$, Zr silicate, $HfO_2$, or Hf silicate.

Figure 1B:
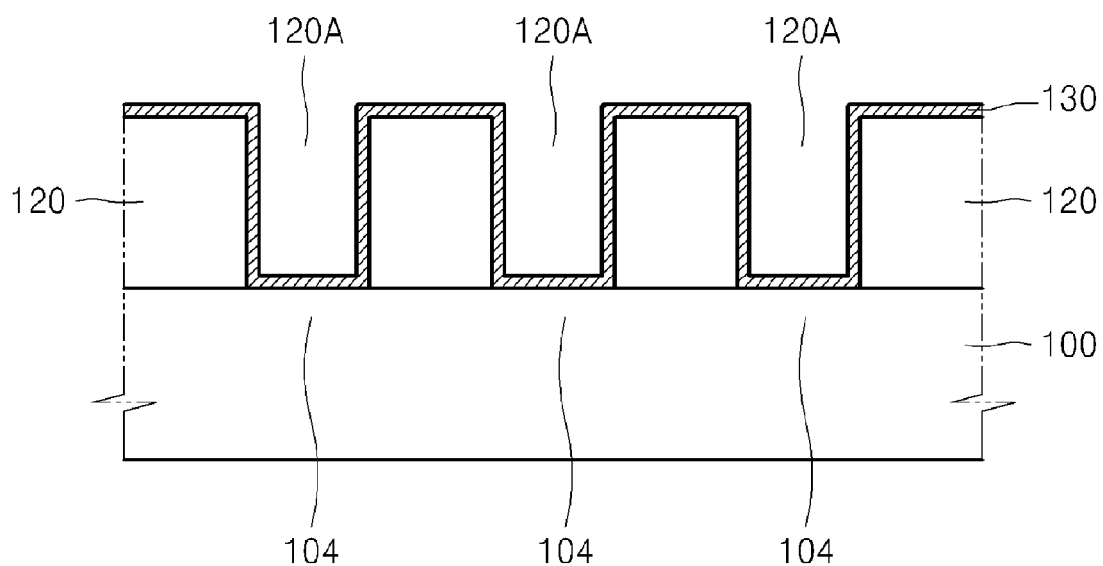

Referring to FIG. 1B, a barrier layer 130 is formed on inner wall of the holes 120A as well as the upper surface of the insulating layer pattern 120 and exposed portions of the conductive region 104. The barrier layer 130 may be formed of one or more materials selected from a group consisting of Ti, Ta, W, and nitrides thereof.

Figure 1C:
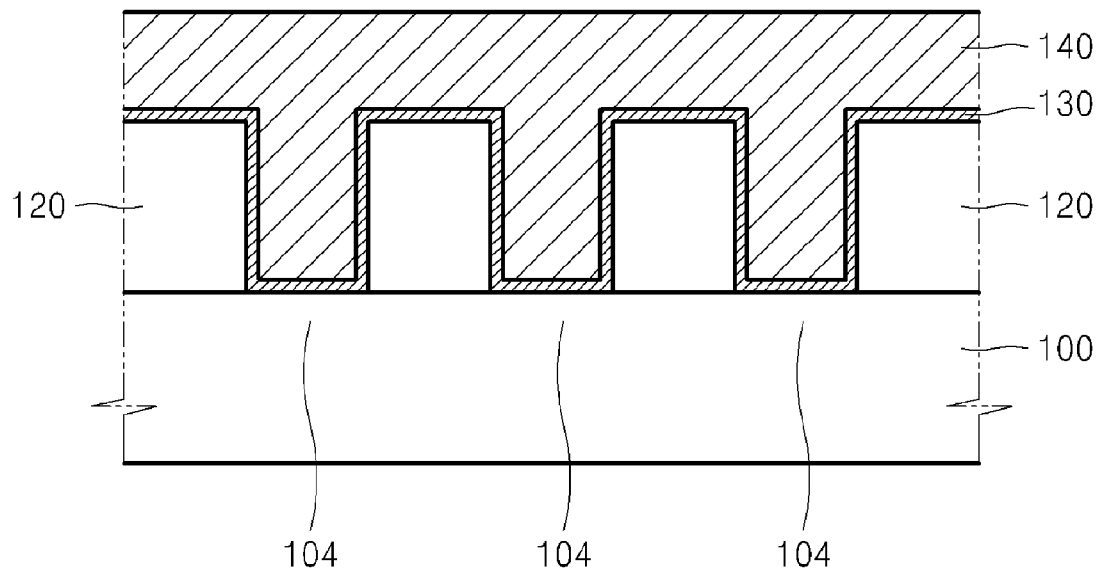

Referring to FIG. 1C, a first metal layer 140 is formed on the barrier layer 130 with a thickness sufficient to completely fill the holes 120A. The first metal layer 140 may be formed of a first metal and/or a first metal nitride. The metal forming the first metal layer 140 may, for example, be formed of one or more selected from a group consisting of Cu, W, Al, Ti, Ta, Au, Ag, and nitrides thereof.

In one specific example, Cu or a Cu alloy may be first metal layer 140, and may be formed using an electro plating process or an electroless plating process. In another specific example, W may be the first metal layer 140, and may be formed using a chemical vapor deposition (CVD) method.

Figure 1D:
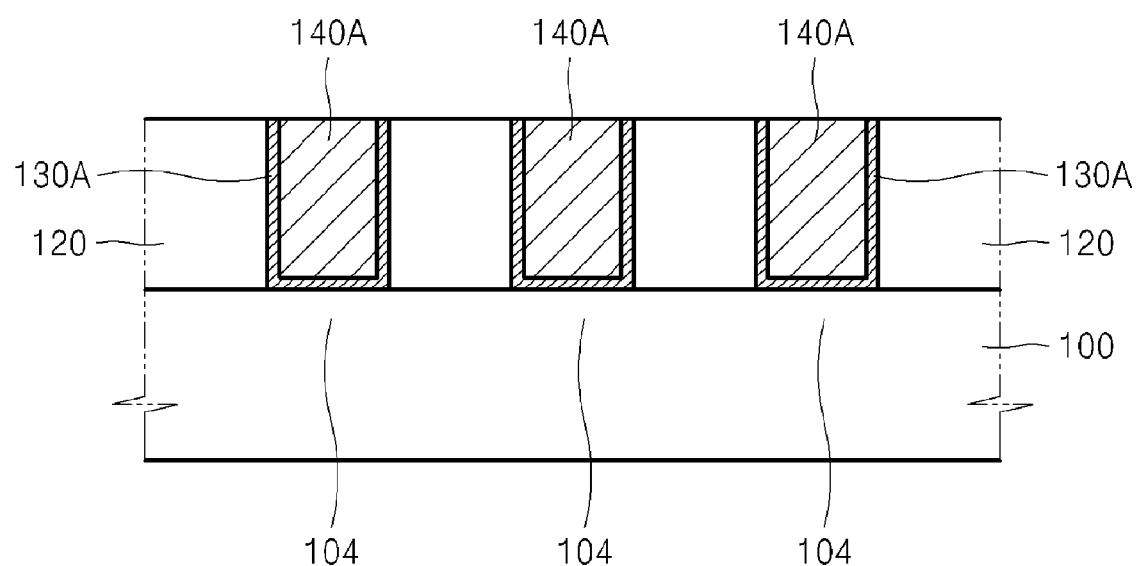

Referring to FIG. 1D, upper portions of the first metal layer 140 and the barrier layer 130 disposed on upper surfaces of the insulating layer pattern 120 are removed using (e.g.) a chemical mechanical polishing (CMP) process and to thereby form a barrier layer pattern 130A and a first metal layer pattern 140A remaining in the holes 120A.

Therefore, upper surfaces of the insulating layer pattern 120, the barrier layer pattern 130A, and the first metal layer pattern 140A will be exposed on the substrate 100. Of note, the upper surface of the insulating layer pattern 120 and the upper surface of the first metal layer pattern 140A exposed on the substrate 100 have very different surface states. In particular, oxygen atoms are included in an oxide material forming on the upper surface of the insulating layer pattern 120. These oxygen atoms have a negative polarity and therefore the exposed upper surface of the insulating layer pattern 120 will have a net negative polarity. On the other hand, the exposed surface of the first metal layer pattern 140A includes negative charges due to free electrons existing in the first metal layer pattern 140A.

Figure 1E:
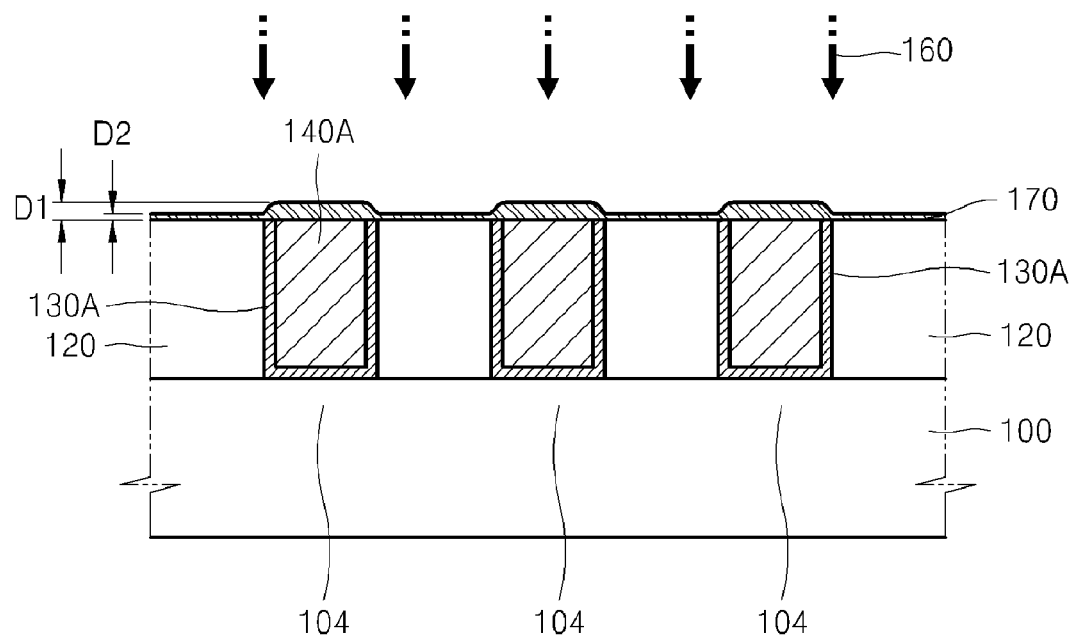

Referring to FIG. 1E, the exposed surfaces of the barrier layer pattern 130A and the first metal layer pattern 140A are pre-treated, and after that, a second metal capping layer 170 including a second metal is formed on the upper surface of the insulating layer pattern 120 and the upper surfaces of the first metal layer pattern 140A and the barrier layer pattern 130A.

The pre-treatment process may be a wet-cleaning process using a cleaning agent, a $N_2$ plasma process, or a $H_2$ plasma process. If necessary, one of the above pre-treatment processes may be performed, or combinations of the various pre-treatment processes may be performed. The above pre-treatment process may be omitted, however, in certain embodiments of the inventive concept.

The second metal capping layer 170 is formed under conditions where the upper surface of the insulating layer pattern 120 and the upper surface of the first metal layer pattern 140A are simultaneously exposed. In order to form the second metal capping layer 170, a deposition process using a second metal organic precursor 160 including the second metal as a source gas to form the second metal capping layer 170 on the upper surface of the insulating layer pattern 120 and the upper surface of the first metal layer pattern 140A is used. The deposition process may be a thermal CVD process, a plasma CVD process, or an atomic layer deposition (ALD) process. The second metal may be different from the first metal.

During the deposition process forming the second metal capping layer 170, different deposition mechanisms are generated on the surface of the first metal layer pattern 140A and the surface of the insulating layer pattern 120 under the same deposition atmosphere. In particular, the second metal capping layer 170 has a first thickness D1 on the upper surface of the first metal layer pattern 140A, and has a second thickness D2, which is less than the first thickness D1, on the upper surface of the insulating layer pattern 120. In addition, the portion of the second metal capping layer 170 located on the first metal layer pattern 140A and the portion of the second metal capping layer 170 located on the insulating layer pattern 120 have different composition ratios from each other.

The second metal organic precursor 160 may be formed of a compound having a chemical formula of Cy-M-(R)$_2$ (hereafter, "Chemical Formula 1").

In Chemical Formula 1, Cy is a functional group including a cyclic compound having negative polarity, M is a trivalent metal atom, and R is a functional group formed of carbon compounds having less polarity than that of M, where M may include a trivalent metal such as Co, Al, Fe, Cr, Ni, Mn, Cu, or Au, and R may include a carbonyl group (—C≡O), a cyano group (—C≡N), or a saturated or unsaturated hydrocarbon group.

In one embodiment, the second metal organic precursor 160 may include cyclopentadienylcobalt dicarbonyl.

Figure 2:
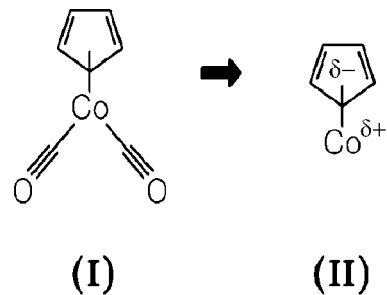
FIG. 2 is a chemical reaction diagram showing an intermediate formed by a thermal decomposition of a Co precursor in a chemical vapor deposition (CVD) reaction chamber, when the CVD process is performed by using the Co precursor for forming a second metal capping layer according to an embodiment of the inventive concept.

FIG. 2 is a diagram showing a reaction intermediate (II) of a Co precursor, in which a Co atom is combined with a cyclopentadienyl ligand, after the cyclopentadienylcobalt dicarbonyl (I) is decomposed by heat and the carbonyl group is detached in the CVD reaction chamber, when the CVD process is performed by using the cyclopentadienylcobalt dicarbonyl (I) as a Co source in order to form the second metal capping layer 170 formed of Co by using the CVD process.

The cyclopentadienylcobalt dicarbonyl may be decomposed by heat, as shown in FIG. 2, when the process temperature is between about 250° C. to 350° C. during the CVD process. After decomposing the cyclopentadienylcobalt dicarbonyl as shown in FIG. 2, the cyclopentanienyl group has negative charges and Co has positive charges in the reaction intermediate (II).

When performing the deposition process forming the second metal capping layer 170 described with reference to FIG. 1E, the deposition environmental conditions may be adjusted in order to have a selective deposition characteristic more favorable to the first metal layer pattern 140A having the metal and the barrier layer pattern 130A than to the insulating layer pattern 120. In one embodiment, when the deposition process forming the second metal capping layer 170 is performed, a temperature of between about 250° C. to 350° C. and a pressure of between about 0.1 Torr to 10 Torr are maintained as deposition environment conditions. When these deposition environmental conditions are maintained, the second metal has the selective deposition characteristic that is more favorable to the first metal layer pattern 140A and the barrier layer pattern 130A than to the insulating layer pattern 120, and accordingly, the second metal capping layer 170 having a greater thickness on the first metal layer pattern 140A and the barrier layer pattern 130A than the thickness on the insulating layer pattern 120 is formed.

In addition, when the deposition process forming the second metal capping layer 170 described with reference to FIG. 1E is performed, auxiliary reaction gases may be supplied into the reaction chamber with the second metal organic precursor 160. As an auxiliary reaction gas, $H_2$, $N_2$, Ar, $O_2$, $NH_3$, NO, $H_2O$, or combinations thereof may be used. In addition, the auxiliary reaction gases may be supplied into the reaction chamber in plasma states when the deposition process for forming the second metal capping layer 170 is performed.

The auxiliary reaction gases help the decomposition of the second metal organic precursor 160 such that the reaction intermediate (II) may be more easily formed when the second metal organic precursor 160 is supplied onto the substrate 100, and helps the reaction intermediate (II) to be selectively attached more to the first metal layer pattern 140A than to the insulating layer 120.

Figure 3:
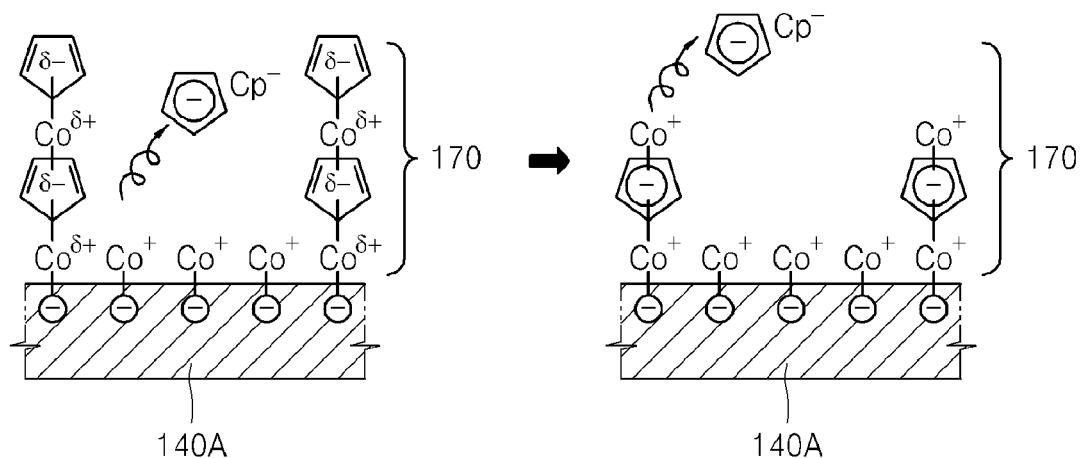
FIG. 3 is a chemical reaction diagram showing a process of depositing a reaction intermediate of a Co precursor on a first metal film pattern according to an embodiment of the inventive concept.

FIG. 3 is a diagram showing a process of depositing the reaction intermediate (II) on the first metal layer pattern 140A, according to an embodiment of the present inventive concept.

In FIG. 3, $Co^+$ ions are adsorbed by electrons of the metal forming the first metal layer pattern 140A, and thus, may be stably deposited on the surface of the first metal layer pattern 140A via relatively strong bonding and a lot of $Co^+$ ions may be absorbed on the first metal layer pattern 140A. In addition, when the strong bonding is formed between a $Co^+$ ion and an electron of the metal forming the first metal layer pattern 140A, the cyclopentadienyl ligand may be stably removed from the $Co^+$ ions in the intermediate (II). Therefore, it is relatively easy to remove the cyclopentadienyl ligand from the $Co^+$ ions in the reaction intermediate (II) on the first metal layer pattern 140A. Due to the above deposition method, the cyclopentadienyl group of low quantity remains in the second metal capping layer 170 that is formed on the first metal layer pattern 140A.

Figure 4:
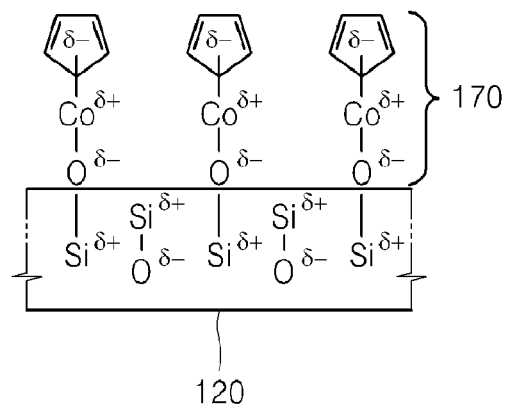
FIG. 4 is a chemical reaction diagram showing a process of depositing a reaction intermediate of a Co precursor on an insulating layer pattern according to an embodiment of the inventive concept.

FIG. 4 is a diagram showing a process of depositing the reaction intermediate (II) on the insulating layer pattern 120.

Referring to FIG. 4, $Co^+$ ions are absorbed on the surface of the insulating layer pattern 120 by oxygen atoms having negative polarities. Here, the strength of the bonding between the $Co^+$ ions and the oxygen atoms of negative polarity is much weaker than that of the bonding between the $Co^+$ ions and the electrons on the first metal layer pattern 140A. Therefore, the absorbed amount of $Co^+$ ions on the insulating layer pattern 120 is less than the absorbed amount of $Co^+$ ions on the first metal layer pattern 140A. In addition, since the strength of the bonding between the $Co^+$ ions and the oxygen atoms is weak on the insulating layer pattern 120, an amount of $Co^+$ ions absorbed on the insulating layer pattern 120 is small, and the decomposition amount of the bonding between the cyclopentadienyl ligand and $Co^+$ ions in the intermediate (II) is small. Therefore, a lot of cyclopentadienyl ligand remains in the second metal capping layer 170.

Referring to FIG. 1E, when the barrier layer pattern 130A includes the metal material, the second metal capping layer 170 may be formed on the barrier layer pattern 130A in a deposition mechanism similar to that on the first metal layer pattern 140A.

Figure 1F:
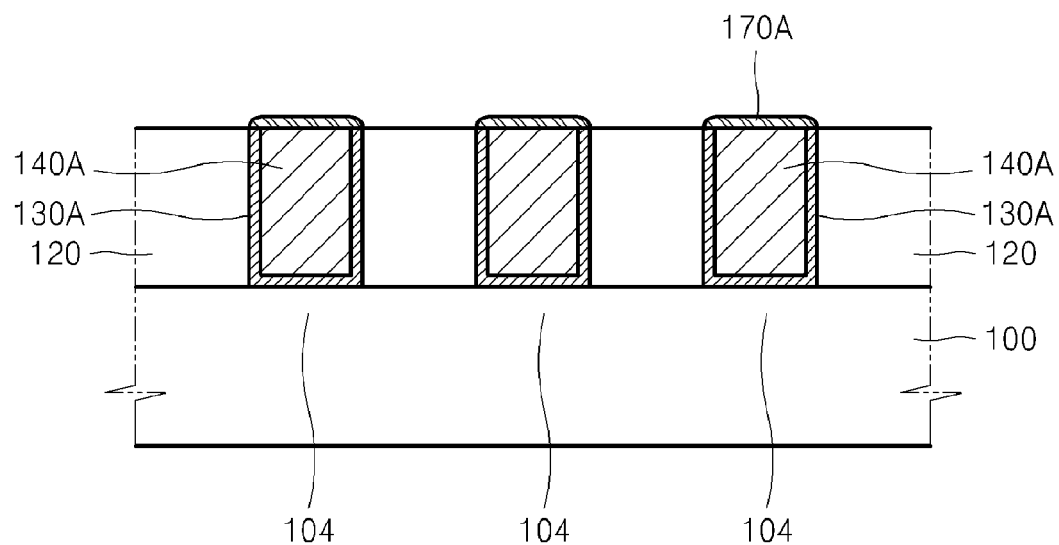

Referring to FIG. 1F, the second metal capping layer 170 is exposed to an etching atmosphere to remove the portions of the second metal capping layer 170 which cover the insulating layer pattern 120 until the upper surface of the insulating layer pattern 120 is exposed.

Here, since the first thickness D1 of the second metal capping layer 170 on the first metal layer pattern 140A is greater than the second thickness D2 of the second metal capping layer 170 on the insulating layer pattern 120, even when the second metal capping layer 170 is exposed to the etching atmosphere until the upper surface of the insulating layer pattern 120 is exposed, a second metal capping layer pattern 170A that is the remaining portion of the second metal capping layer 170 remains on the upper surfaces of the first metal layer pattern 140A and the barrier layer pattern 130A.

The etching atmosphere may be formed by a wet-etching process or a dry-etching process. For example, if the insulating layer pattern 120 is formed of a silicon oxide layer and the second metal capping layer pattern 170A is formed of a Co layer, a HF etchant may be used to entirely etch the second metal capping layer 170 until the insulating layer pattern 120 is exposed so as to form the second metal capping layer pattern 170A. Otherwise, the dry-etching process that performs the etch-back of the second metal capping layer 170 until the insulating layer pattern 120 is exposed may be used.

As described above, according to certain embodiments of the inventive concept, the second metal capping layer pattern 170A is selectively formed on the upper surfaces of the first metal layer pattern 140A and the barrier layer pattern 130A using the selective deposition characteristics favorable to the metal layer, and thus, a costly photolithography process may be omitted. In addition, the second metal capping layer pattern 170A may be formed simply and easily.

For example, when the first metal layer pattern 140A is formed of a Cu layer and the second metal capping layer pattern 170A is formed of a Co layer, the second metal capping layer pattern 170A formed of the Co layer prevents an electro-migration (EM) phenomenon from occurring in the first metal layer pattern 140A, and thus, the reliability of the Cu layer may be improved.

Figure 5:
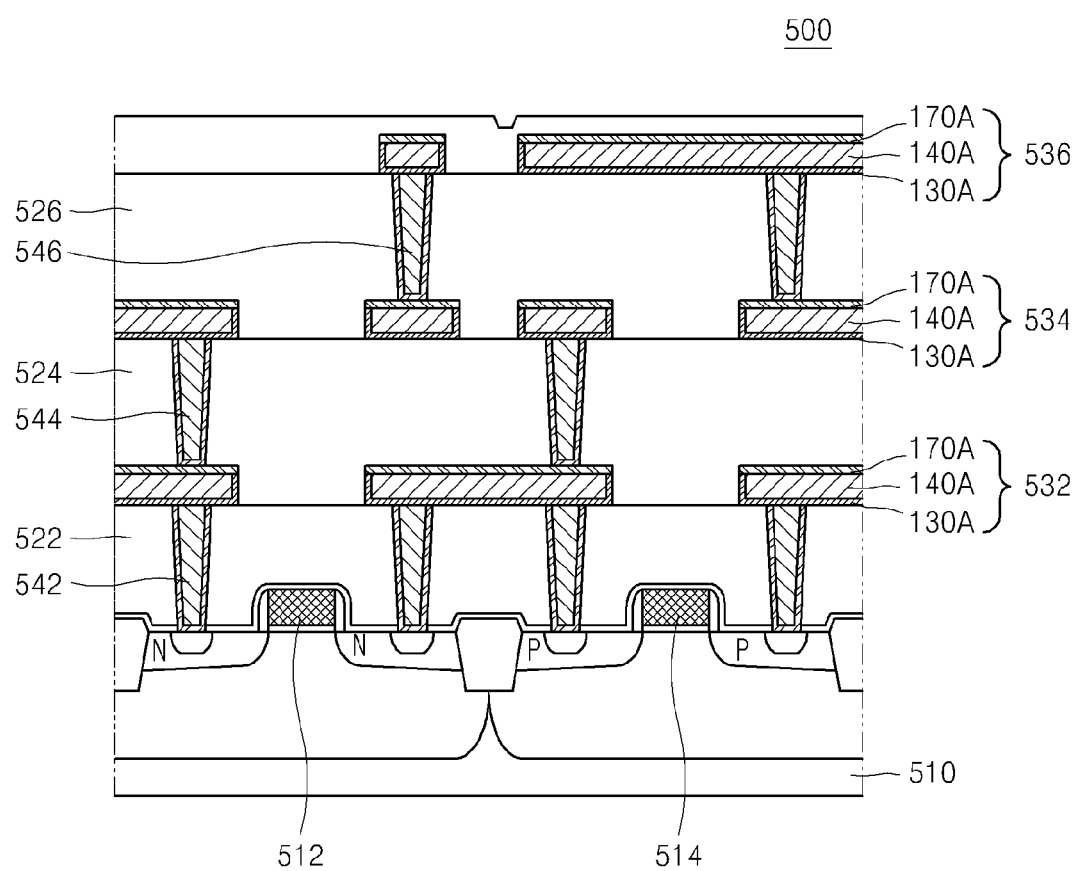
FIG. 5 is a semiconductor device cross-sectional view illustrating a method of fabricating a semiconductor device according to an embodiment of the inventive concept.

FIG. 5 is a partial cross-sectional view of a semiconductor device 500 further illustrating a method of fabricating for a semiconductor device according to an embodiment of the inventive concept.

Referring to FIG. 5, according to one possible method of fabricating the semiconductor device 500, a plurality of transistors including gates 512 and 514 may be formed on a semiconductor substrate 510. A plurality of interlayer dielectrics 522, 524, and 526 may be formed on upper portions of the transistors. A plurality of metal wiring layers 532, 534, and 536 may be formed on the plurality of interlayer dielectrics 522, 524, and 526, respectively, for electrically connecting the plurality of transistors to each other. In addition, a plurality of contact plugs 542, 544, and 546 may be formed to electrically connect the plurality of metal wiring layers 532, 534, and 536 to each other. In FIG. 5, three layers of metal wiring layers 532, 534, and 536 are formed; however, the present inventive concept is not limited thereto, and more metal wiring layers may be formed if necessary.

In order to form the plurality of metal wiring layers 532, 534, and 536, the barrier layer patterns 130A, the first metal layer patterns 140A, and the second metal capping layer patterns 170A may be formed by using the processes described with reference to FIGS. 1A through 1F.

The plurality of interlayer dielectrics 522, 524, and 526 may be formed of a silicon oxide layer, a silicon oxynitride layer, a high-k layer, or combinations thereof. The high-k layer may include, for example, $(Ba_X, Sr_{1-X})TiO_3(BST)$, $TiO_2$, $Ta_2O_5$, $Al_2O_3$, $ZrO_2$, Zr silicate, $HfO_2$, or Hf silicate.

Figure 6:
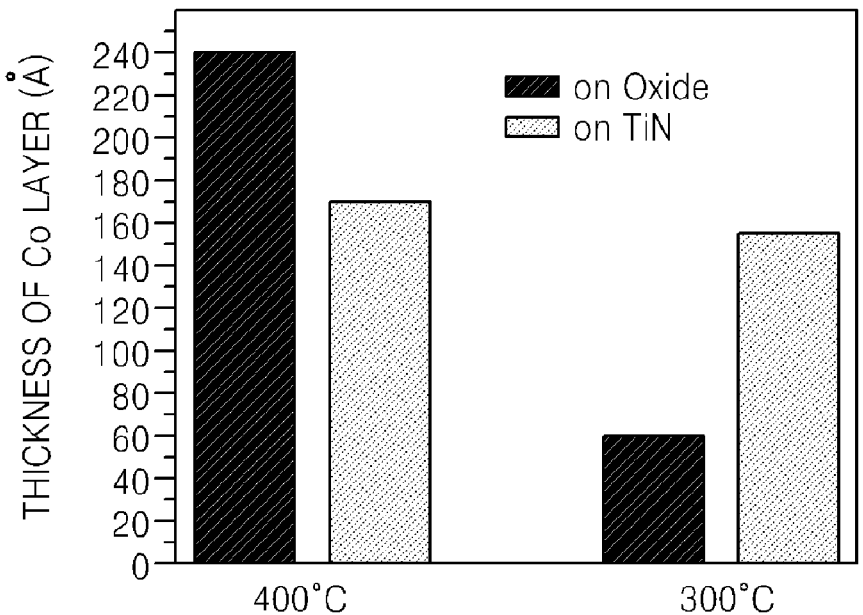
FIG. 6 is a graph showing evaluation results for selective deposition characteristics of a metal according to the processing temperature, when a second metal capping layer pattern is formed on a silicon oxide layer and a TiN layer formed on the substrate by using a metal precursor in a method of forming metal films according to an embodiment of the p inventive concept.
Figure 7:
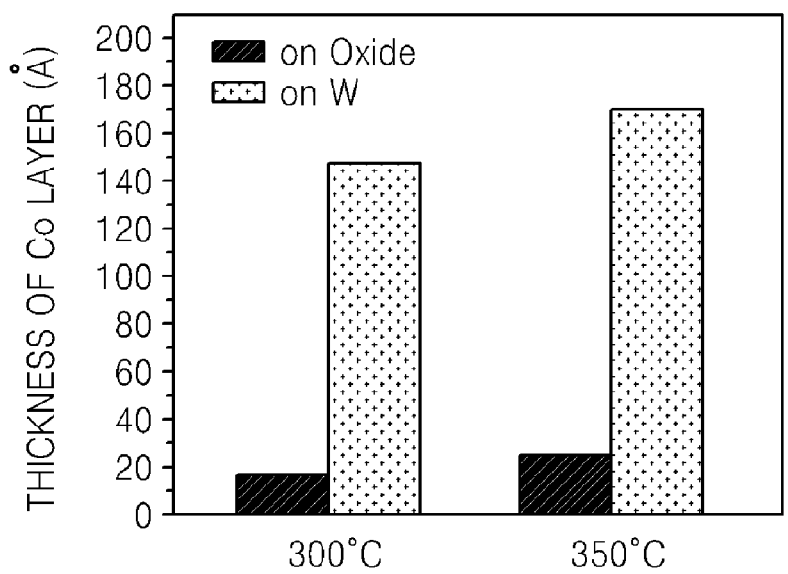
FIG. 7 is a graph showing evaluation result of selective deposition characteristics of a metal according to the processing temperature, when a second metal capping layer pattern is formed on a silicon oxide layer and a W layer formed on the substrate by using a metal precursor in a method of forming metal films according to an embodiment of the inventive concept.

FIGS. 6 and 7 are graphs showing evaluation results of selective deposition characteristics of a second metal ("M" within the Chemical Formula 1) as a function of processing temperature when the second metal capping layer pattern 170A is formed on various under-layers formed on a substrate during a thermal CVD process using the second metal organic precursor represented in the Chemical Formula 1.

When performing the evaluation, the results of which shown in FIG. 6, the second metal capping layer pattern 170A was formed of Co. Cyclopentadienylcobalt dicarbonyl precursor was used as the Co precursor. In order to form the second metal capping layer patterns 170A respectively on various under-layers formed on the substrate, cyclopentadienylcobalt dicarbonyl contained in a canister maintained at a temperature of 30° C. was supplied into a reaction chamber for performing the CVD process. At this time, Ar of 300 sccm was used as a carrier gas, and Ar of 300 sccm was further supplied into the reaction chamber as a reaction gas. Co layers were respectively formed on a silicon oxide layer and a TiN layer under conditions where temperatures of the substrate were 400° C. and 300° C., respectively. Other conditions except for the processing temperature were the same in both comparative examples.

As shown in the graph of FIG. 6, when the temperature of the substrate was 400° C., the Co layer formed on the silicon oxide layer was thicker than the Co layer formed on the TiN layer. Here, a ratio between the thicknesses of the Co layer formed on the TiN layer and the Co layer formed on the silicon oxide layer was about 0.6:1. On the other hand, when the temperature of the substrate was 300° C., the Co layer formed on the TiN layer was much thicker than the Co layer formed on the silicon oxide layer. Here, a ratio between the thicknesses of the Co layer formed on the TiN layer and the Co layer formed on the silicon oxide layer was about 3:1.

When performing the evaluation, the results of which are shown in the graph of FIG. 7, the second metal capping layer pattern 170A was formed of Co. Cyclopentadienylcobalt dicarbonyl precursor was used as the Co precursor. In order to form the second metal capping layer patterns 170A respectively on various under-layers formed on the substrate, cyclopentadienylcobalt dicarbonyl contained in a canister maintained at a temperature of 30° C. was supplied into a reaction chamber for performing the CVD process. At this time, Ar of 300 sccm was used as a carrier gas, and Ar of 300 sccm was further supplied into the reaction chamber as a reaction gas. Co layers were respectively formed on a silicon oxide layer and a W layer under conditions where temperatures of the substrate were 350° C. and 300° C., respectively. Other conditions except for the processing temperature were the same in both comparative examples.

As shown in the graph of FIG. 7, when the temperature of the substrate was 350° C., the Co layer formed on the W layer was much thicker than the Co layer formed on the silicon oxide layer. Here, a ratio between the thicknesses of the Co layer formed on the W layer and the Co layer formed on the silicon oxide layer was about 8:1. On the other hand, when the temperature of the substrate was 300° C., the Co layer formed on the W layer was much thicker than the Co layer formed on the silicon oxide layer. Here, a ratio between the thicknesses of the Co layer formed on the TiN layer and the Co layer formed on the silicon oxide layer was about 6:1.

From the evaluation results shown in FIGS. 6 and 7, it can be seen that the Co layer is selectively deposited more on the metal layer than on the silicon oxide layer as the CVD processing temperature is lowered, when the processing temperature is 400° C. or less.

Figure 8:
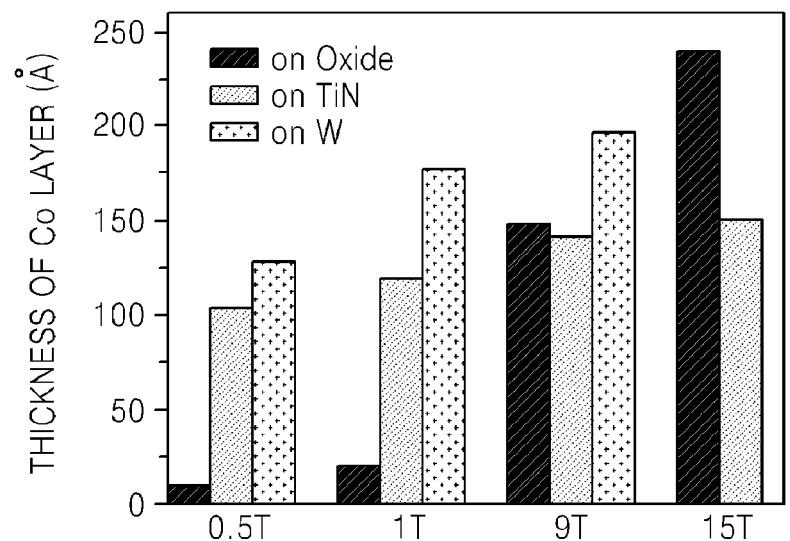
FIG. 8 is a graph showing evaluation result of selective deposition characteristics of a metal according to the processing pressure, when a second metal capping layer pattern is formed on a silicon oxide layer, a TiN layer, and W layer formed on the substrate by using a metal precursor in a method of forming metal films according to an embodiment of the inventive concept.

FIG. 8 is a graph showing evaluation results of selective deposition characteristics of a second metal ("M" in the Chemical Formula 1) according to the processing pressure when the second metal capping layer pattern 170A is formed on various under-layers formed on a substrate in a thermal CVD process by using the second metal organic precursor that is represented in the Chemical Formula 1.

When performing the evaluation, the results of which are shown in FIG. 8, the second metal capping layer pattern 170A was formed of Co. Cyclopentadienylcobalt dicarbonyl precursor was used as the Co precursor. In order to form the second metal capping layer patterns 170A respectively on various under-layers formed on the substrate, cyclopentadienylcobalt dicarbonyl contained in a canister maintained at a temperature of 30° was supplied into a reaction chamber for performing the CVD process. At this time, Ar of 300 sccm was used as a carrier gas, and Ar of 300 sccm was further supplied into the reaction chamber as a reaction gas. The temperature of the substrate was 300° C. Co layers were formed on a silicon oxide layer, a TiN layer, and a W layer under conditions where pressures were 0.5 Torr, 1 Torr, 9 Torr, and 15 Torr, respectively. Other conditions except for the processing pressure were the same in both comparative examples.

As shown in the graph of FIG. 8, when the pressure was 0.5 Torr, 1 Torr, 9 Torr, and 15 Torr, ratios between the thicknesses of the Co layer formed on the W layer and the Co layer formed on the silicon oxide layer were 14:1, 10:1, 1.3:1, and 0.6:1.

As shown in the graph of FIG. 8, the thickness of the Co layers formed on the TiN layer and the W layer were much greater than the Co layer formed on the silicon oxide layer under the pressure of 9 Torr or less. In addition, under the pressure of 9 Torr of less, as the CVD processing pressure is reduced, the Co layer is selectively deposited more on the metal layer than on the silicon oxide layer.

Figure 9:
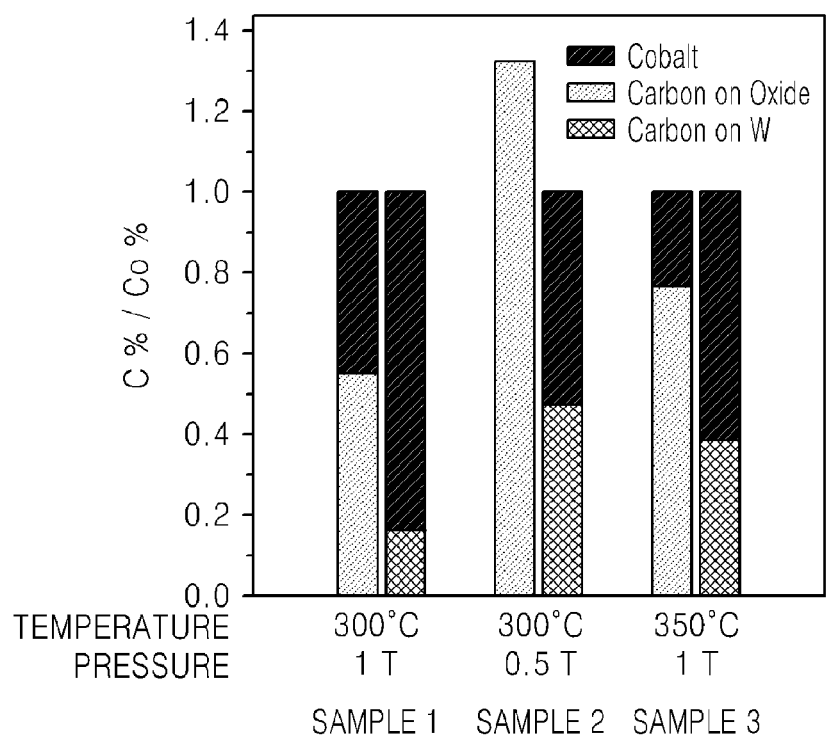
FIG. 9 is a graph showing ratios of the amount of C with respect to the amount of Co in second metal capping layer patterns, which are respectively formed on a silicon oxide layer and a W layer on a substrate by using metal precursor in a thermal CVD process according to an embodiment of the inventive concept.

FIG. 9 is a graph showing a content ratio between C and Co in the second metal capping layer pattern 170A when the second metal capping layer pattern 170A formed of the Co layer is formed on various under-layers by using the second metal organic precursor 160 that is represented by the Chemical Formula 1 in the thermal CVD process according to a method consistent with embodiments of the inventive concept.

For obtaining the graph of FIG. 9, the second metal capping layer pattern 170A was formed of Co respectively on the silicon oxide layer and the W layer with respect to three samples (sample 1 through sample 3) under combinations of different processing temperatures and different processing pressures. Cyclopentadienylcobalt dicarbonyl precursor was used as the Co precursor. CVD processing conditions for sample 1 were the substrate temperature of 300° and pressure of 1 Torr, for sample 2 were a temperature of 300° C. and a pressure of 0.5 Torr, and for sample 3 were a temperature of 350° C. and a pressure of 1 Torr. In addition, in samples 1 and 2, for forming the second metal capping layer pattern 170A on the silicon oxide layer and the W layer that are formed on the substrate, cyclopentadienylcobalt dicarbonyl contained in the canister of a temperature of 30° C. was supplied into a reaction chamber for performing the CVD process. At this time, Ar of 300 sccm was used as a carrier gas, and Ar of 300 sccm was further supplied into the reaction chamber as a reaction gas. In addition, in sample result shown in FIG. 9, for forming the second metal capping layer pattern 170A on the silicon oxide layer and the W layer that are formed on the substrate, cyclopentadienylcobalt dicarbonyl contained in the canister of a temperature of 30° C. was supplied into a reaction chamber for performing the CVD process. At this time, Ar of 300 sccm was used as a carrier gas, and Ar of 300 sccm and $H_2$ gas of 10000 sccm were further supplied into the reaction chamber as reaction gases. In each of the samples, other conditions except for the provided temperature and pressure were the same as each other.

In FIG. 9, with respect to samples 1 through 3, a content amount of Co component included in a unit volume of the Co layer formed on the silicon oxide layer is set as 1.0%, and the content ratio of the C component in the unit volume (hereinafter, "C content amount in the silicon oxide layer"), which is converted based on the above Co content amount, is shown. In addition, after the content amount of the Co component included in unit volume of the Co layer formed on the W layer is set as 1.0%, and then, the content ratio of the C component in the unit volume (hereinafter, "C content amount in the W layer"), which is converted based on the above Co content amount, is shown in FIG. 9. In the case of sample 1, a ratio between the C content amount in the silicon oxide layer and the C content amount in the W layer was about 3.3:1. In the case of sample 2, a ratio between the C content amount in the silicon oxide layer and the C content amount in the W layer was about 2.8:1, and in the case of sample 3, a ratio between the C content amount in the silicon oxide layer and the C content amount in the W layer is about 2:1.

In the graph of FIG. 9, C is detected in the Co layer because the cyclopentadienyl ligand remains in the Co layer. The reason why the C content amount in the silicon oxide layer is greater than the C content amount in the W layer was described with reference to FIGS. 3 and 4.

According to results of the graph of FIG. 9, as the deposition selectivity of Co with respect to W becomes greater than the deposition selectivity of Co with respect to the silicon oxide layer in the CVD processing conditions, that is, as the CVD processing temperature and pressure are reduced, the content amount of C in the Co layer that is formed on the W layer is reduced.

When the second metal capping layer pattern 170A formed of metal is formed on various under-layers according to the method of forming metal layers of the embodiments of the present inventive concept, selective deposition characteristics of the metal organic precursors that are sources of the metal are compared with each other.

In the present example, to be compared with the selective deposition characteristic of the cyclopentadienylcobalt dicarbonyl that is the Co precursor used in the above examples 1-3, the second metal capping layer patterns 170A are respectively formed on the substrates, on which the silicon oxide layer and the TiN layer are formed, by using an Ni precursor, that is, bis[1-dimethylamino-2-methyl-2-butoxy]Ni(II).

For performing the evaluation, CVD processing conditions for sample 1 were a substrate temperature of 300° and pressure of 0.58 Torr, for sample 2 were a temperature of 300° C. and the pressure of 1 Torr, and for sample 3 were a temperature of 350° C. and the pressure of 1 Torr. In addition, with respect to each of the samples 1-3, Ar of 143 sccm was used as a carrier gas of bis[1-dimethylamino-2-methyl-2-butoxy]Ni(II) that is the Ni precursor, and other reaction gases except for the Ni precursor were not provided. Other conditions except for the above given conditions were the same in the samples 1-3.

As a result of evaluation illustrated in FIG. 9, in a sample 1, Ni layers formed on the silicon oxide layer and the TiN layer were formed to thicknesses of 225 Å and 106 Å, respectively. In a sample 2, Ni layers formed on the silicon oxide layer and the TiN layer were formed to thicknesses of 1170 Å and 826 Å, respectively, and in a sample 3, Ni layers formed on the silicon oxide layer and the TiN layer were formed to thicknesses of 1156 Å and 251 Å, respectively.

As shown in the above results, when the second metal capping layer patterns 170A are formed on the substrate, on which the silicon oxide layer and the TiN layer are formed, by using bis[1-dimethylamino-2-methyl-2-butoxy]Ni(II) as the Ni precursor, the Ni layer was preferably deposited on the silicon oxide layer, and thus, the Ni layer has the selective deposition characteristic with respect to the silicon oxide layer.

The above result is obtained because the bis[1-dimethylamino-2-methyl-2-butoxy]Ni(II) that is the Ni precursor includes Ni—O ligand and Ni—N ligand having a relatively large polarity while the cyclopentadienylcobalt dicarbonyl that is the Co precursor includes —C≡O ligand having relatively small polarity. When the Ni precursor including the ligands such as Ni—O and Ni—N having a large polarity is used, bonding between the $Ni^{2+}$ ions and the electrons existing on the surface of the metal layer in the CVD deposition process is interfered by the ligand.

While the inventive concept has been particularly shown and described with reference to exemplary embodiments thereof, it will be understood that various changes in form and details may be made therein without departing from the scope of the following claims.

What is claimed is:

1. A method of forming a metal layer, the method comprising:
    preparing a substrate including exposed portions of an insulating layer and a metal layer comprising a first metal; and
    forming a metal capping layer by supplying an organic precursor of a second metal onto the substrate to deposit the second metal simultaneously on the insulating layer and the metal layer, wherein the metal capping layer is deposited with different thicknesses on the insulating layer and the metal layer.

2. The method of claim 1, wherein the forming of the metal capping layer is performed at a processing temperature in a range between about 250° C. to 350° C.

3. The method of claim 1, wherein the forming of the metal capping layer is performed under a processing pressure in a range between about 0.1 Torr to 10 Torr.

4. The method of claim 1, wherein the first metal and the second metal are different metals.

5. The method of claim 1, wherein the organic precursor is a compound represented by the formula Cy-M-(R)$_2$, where Cy is a functional group including a cyclic compound having negative polarity, M is a trivalent metal atom, and R is a carbon compound having less polarity than the polarity of the R.

6. The method of claim 5, wherein M is one of Co, Al, Fe, Cr, Ni, Mn, Cu, and Au.

7. The method of claim 5, wherein R is a carbonyl group (—C≡O), a cyano group (—C≡N), or a saturated or unsaturated hydrocarbon group.

8. The method of claim 1, wherein the second metal is Co, and the organic precursor is cyclopentadienylcobalt dicarbonyl.

9. The method of claim 1, wherein the first metal is at least one selected from a group consisting of Cu, W, Al, Ti, Ta, Au, Ag, and nitrides thereof.

10. The method of claim 1, wherein the insulating layer is at least one selected from a group consisting of a silicon oxide, a silicon oxynitride, $(Ba_X, Sr_{1-X})TiO_3$(BST), $TiO_2$, $Ta_2O_5$, $Al_2O_3$, $ZrO_2$, Zr silicate, $HfO_2$, and Hf silicate.

11. The method of claim 1, wherein the metal capping layer has one portion formed on the metal layer that is thicker than another portion formed on the insulating layer.

12. The method of claim 11, further comprising:
    forming a metal capping layer pattern that is a remnant of the metal capping layer on the metal layer by exposing the metal capping layer under an etching atmosphere until the insulating is exposed after forming the metal capping layer.

13. The method of claim 12, wherein the etching atmosphere is defined by a wet-etching process using an etchant.

14. The method of claim 12, wherein the etching atmosphere is defined by a dry-etching process comprising an etch-back process of the metal capping layer.

15. A method of fabricating a semiconductor device, the method comprising:
    forming an insulating layer pattern having holes exposing conductive regions of a substrate;
    forming a first metal layer in the holes;
    forming a second metal layer on the insulating layer pattern and the first metal layer by supplying a metal organic precursor onto the substrate under processing conditions, such that the second metal layer is formed with a greater a thicker on the first metal layer than on the insulating layer pattern; and
    forming a second metal capping layer pattern that is a remnant of the first metal layer by exposing the second metal layer to an etching atmosphere until the portion of the second metal layer on the insulating layer pattern is removed and the insulating layer pattern is exposed.

16. The method of claim 15, wherein the processing conditions include a temperature in a range of between about 250° C. to 350° C., and a pressure in a range of between about 0.1 Torr to 10 Torr.

17. The method of claim 15, wherein the first metal layer is formed from at least one selected from a group consisting of Cu, W, Al, Ti, Ta, Au, Ag, and nitrides thereof.

18. The method of claim 15, wherein the second metal layer comprises Co.

19. The method of claim 15, wherein the metal organic precursor is cyclopentadienylcobalt dycarbonyl.

20. A method of fabricating a semiconductor device, the method comprising:
    forming an insulating layer pattern having holes exposing conductive regions of a substrate;
    forming a barrier layer and a metal layer sequentially in the holes;
    forming a capping layer on the insulating layer pattern, the barrier layer, and the metal layer by supplying a Co organic precursor onto the substrate under processing conditions in which a temperature is maintained in a range of between about 250° C. to 350° C., and a pressure is maintained in a range of between about 0.1 Torr to 10 Torr, wherein the capping layer is formed with a greater thickness on the metal layer than on the insulating layer pattern; and
    forming a capping layer pattern that is a remnant of the capping layer remaining on the metal layer by removing the capping layer to a predetermined thickness from an upper surface of the capping layer until the insulating layer pattern is exposed.

* * * * *